US005525767A

United States Patent [19]

Fields

[11] Patent Number: 5,525,767

[45] Date of Patent: Jun. 11, 1996

[54] HIGH-PERFORMANCE SOUND IMAGING SYSTEM

[76] Inventor: Walter Fields, 155 Fifth Ave. South, Ste. 150, Minneapolis, Minn. 55401

[21] Appl. No.: 231,380

[22] Filed: Apr. 22, 1994

[51] Int. Cl.[6] .................... H05K 5/00

[52] U.S. Cl. .................... 181/155; 181/153; 181/154; 181/145; 181/146; 181/151; 181/199

[58] Field of Search .................... 181/151, 153, 181/154, 155, 145, 1467199, 176

[56] References Cited

U.S. PATENT DOCUMENTS

| | | | |
|---|---|---|---|
| 3,912,866 | 10/1975 | Fox | 181/152 |
| 4,210,223 | 7/1980 | Gillum et al. | 181/152 |
| 4,348,549 | 9/1982 | Berlant | 181/155 X |
| 5,086,871 | 2/1992 | Barbe | 181/145 |

*Primary Examiner*—Khanh Dang

*Attorney, Agent, or Firm*—Briggs & Morgan

[57] ABSTRACT

A sound imaging system preferably including two enclosures each comprising a truncated conical base unit and a truncated conical upper unit supported above and spaced apart from of the base unit, and containing a bass driver and composite midrange and high frequency drivers. The bass driver is oriented horizontally at the top of the base unit, and the sound energy produced therefrom is reflected by a conically shaped acoustic lens or defector depending from within the interior of the upper unit directly above the bass driver, such that the sound energy is reflected downwardly along and between the spaced apart truncated conical walls of the upper unit and base unit and emanates radially therefrom in all directions. The composite midrange and high frequency drivers are supported at the top of the upper unit on a crown structure having a plurality of vertical legs defining a platform oriented approximately 20° relative to horizontal.

32 Claims, 5 Drawing Sheets

HIGH-PERFORMANCE SOUND IMAGING SYSTEM

BACKGROUND OF THE INVENTION

1. Field of the Invention

This invention relates generally to loudspeakers for reproducing recorded sound, and particularly to a high-performance sound imaging system for reproducing and projecting recorded sound in a manner that simulates or duplicates the listener's presence at a recorded or broadcast event.

2. Prior Art

The art relating to loudspeakers and speaker components for reproducing recorded sound is well defined, particularly within the field of reproducing events recorded on phonographic albums, compact discs, laser optical discs, and similar media, as well as projecting broadcast performances of such events.

The term "sound imaging" has been adopted to identify systems for accurately reproducing and projecting recorded sound in a manner that simulates or duplicates the listener's presence at the recorded or broadcast event. The performance characteristics of such systems are most frequently utilized for reproducing or projecting musical performances, with the technical capabilities and aural aesthetic qualities of high-performance systems being challenged by musical performances currently available on recorded media.

Loudspeaker systems usually include one or more drivers that are disposed within one or more enclosures or cabinets. The conventional drivers are commonly referenced as and will usually include at least one bass (woofer), midrange, and high frequency (tweeter). The trend in moderate to expensive loudspeaker systems has been toward one individual unidirectional bass driver placed on or near the floor of a room with two or more paired sets of midrange and high frequency drivers disposed at a higher elevation from the floor and spaced strategically proximate to the perimeter of the room to project sound energy inwardly toward the listener from multiple directions. In such systems, the location of the drivers may be correlated to different channels of the recorded event, so that the listener perceives spatial orientation or movement during the reproduction or projection of the recorded aural performance, particularly when the aural performance is combined with a visual performance such as an optical laserdisc recording.

U.S. Pat. No. to 5,181,247 to Holl discusses various electronic circuits utilized for selecting between channels for acoustic output in different modes, including video broadcasts and projection of recorded performances to obtain a "surround sound" effect. The Holl '247 patent provides a representative example of current developments in the level of commercially available loudspeaker systems for recorded and broadcast performances, and uses the descriptive phrase "sound image enhancing." However, to those skilled in the art the terms "sound imaging" or "sound image enhancement" are intended to convey a more complex and dynamic representation of the performance or event that was recorded or broadcast, involving the position, placement, and orientation of the drivers relative to one another and with reference to the original microphone or pickup position.

The use of reflected sound energy in enclosures for drivers to accomplish radiation of sound energy is known, as is the use of fiberglass enclosures or partitions to selectively differentiate between varying frequency ranges. A representative example discussing both of these principles is U.S. Pat. No. Re. 31,228 to Bose.

BRIEF SUMMARY OF THE INVENTION

It is the object of this invention to design a high-performance sound imaging system that accurately simulates or duplicates the listener's presence at a recorded or broadcast event.

It is a related object of this invention to design the above sound imaging system so as to utilize two enclosures each containing a bass driver and combined midrange and high frequency drivers in the preferred embodiment.

It is a distinct object of this invention to design the above sound imaging system so that the bass driver is housed within an enclosure that provides for both the optimized reflection and acoustic amplification of sound energy as well as unrestricted unidirectional propagation of that sound energy throughout a 360° pattern emanating from that bass driver.

Briefly described, the sound imaging system of this invention preferably includes two enclosures each comprising a truncated conical base unit and a truncated conical upper unit supported above and spaced apart from of the base unit, and containing a bass driver and composite midrange and high frequency drivers. The bass driver is oriented horizontally at the top of the base unit, and the sound energy produced therefrom is reflected by a conical acoustic lens or defector depending from within the interior of the upper unit directly above the bass driver, such that the sound energy is reflected downwardly along and between the spaced apart truncated conical walls of the upper unit and base unit and emanates radially therefrom in all directions. The composite midrange and high frequency drivers are supported at the top of the upper unit on a crown structure having a plurality of vertical legs defining a platform oriented approximately 20° relative to horizontal.

DESCRIPTION OF THE PREFERRED EMBODIMENTS

Figure 1:
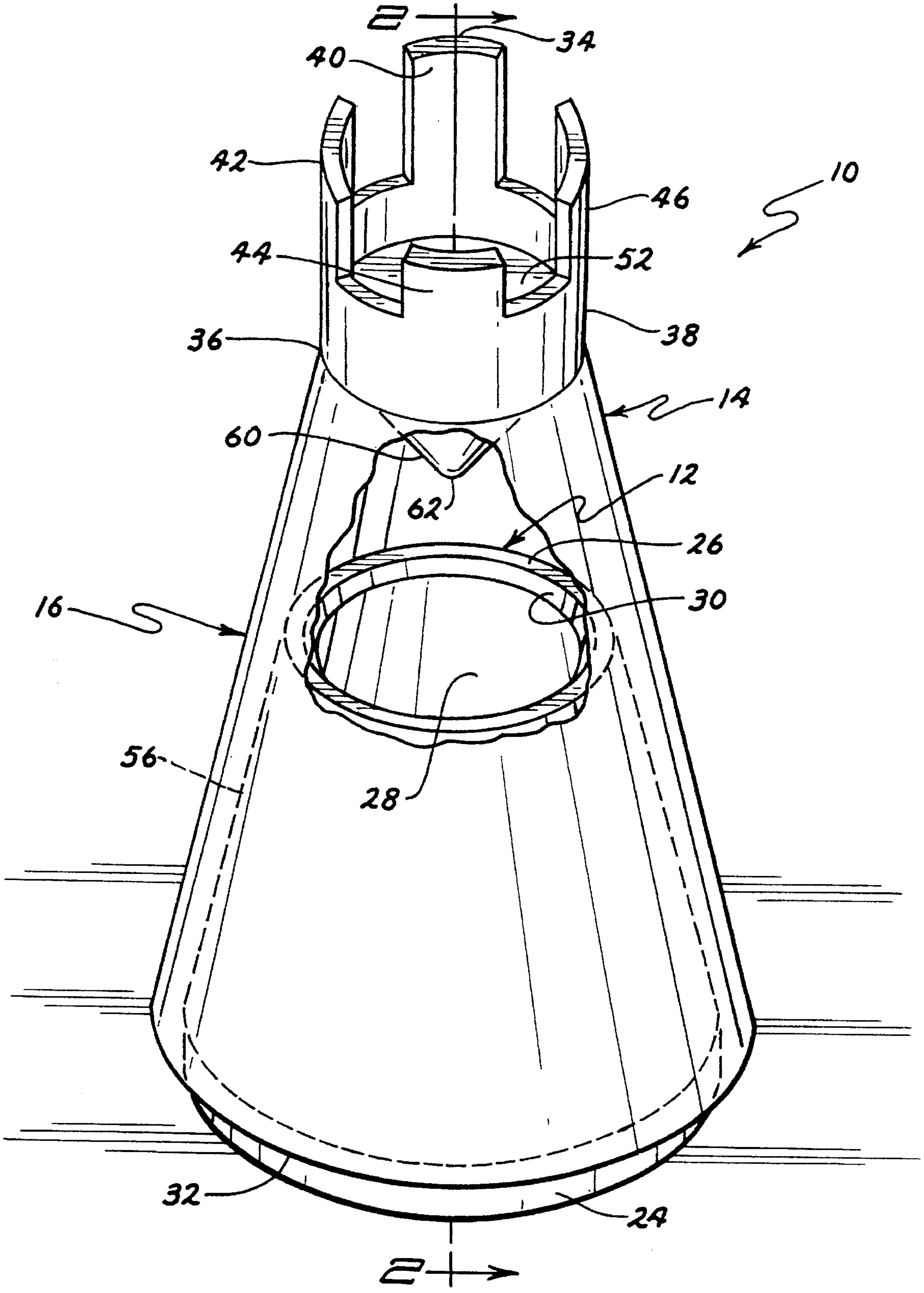
FIG. 1 is a perspective view of the enclosure of the sound imaging system of this invention.

The sound imaging system of this invention is shown in FIGS. 1–5 and referenced generally therein by the numeral 10.

The sound imaging system 10 includes a base unit 12 and an upper unit 14 which together form an enclosure 16 that supports and houses a bass driver 18 and a combined or composite midrange driver 20 and high frequency driver 22.

Figure 2:
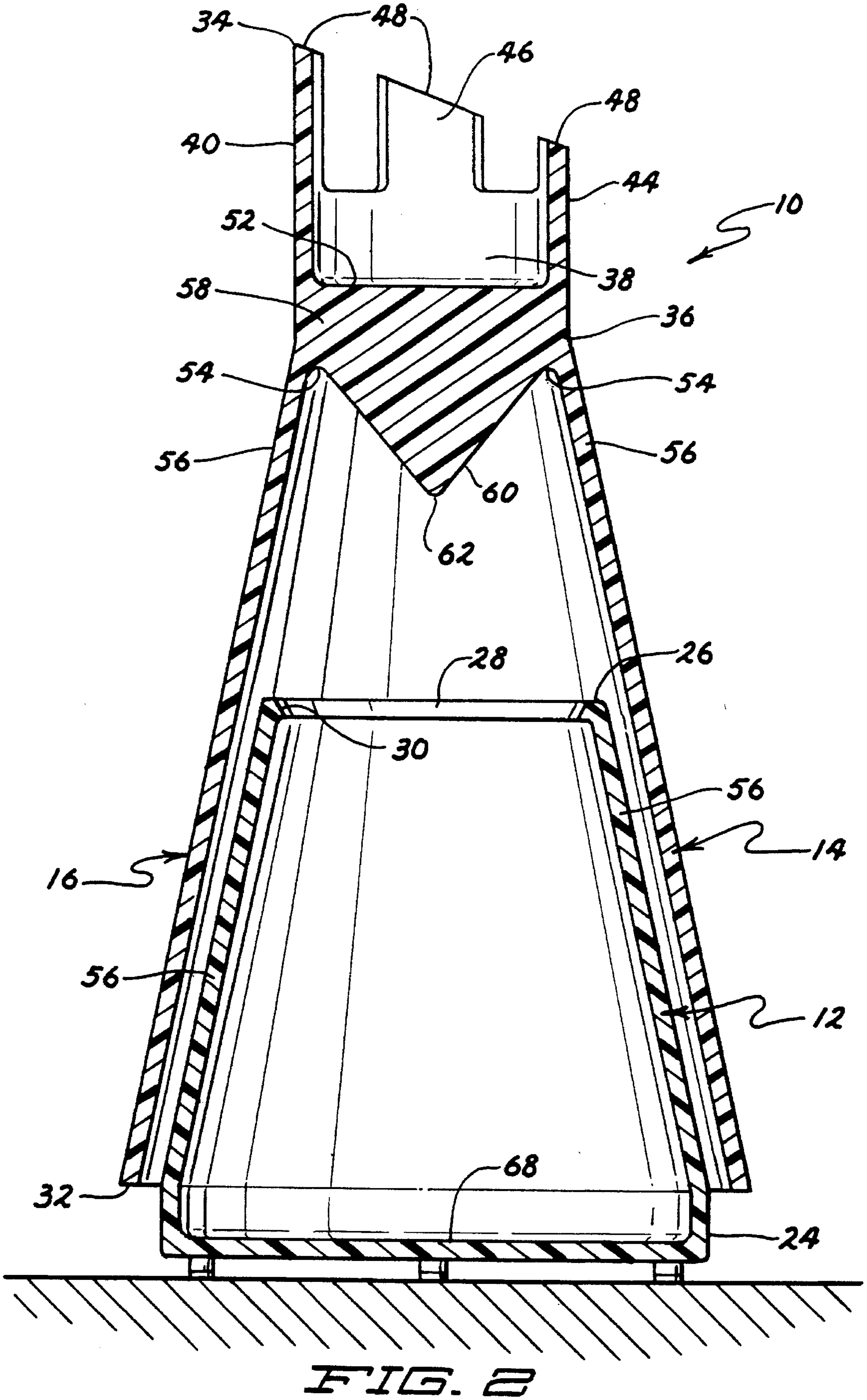
FIG. 2 is a side cross section view of the enclosure of the sound imaging system of FIG. 1 taken through line 2—2 of FIG. 1.
Figure 3:
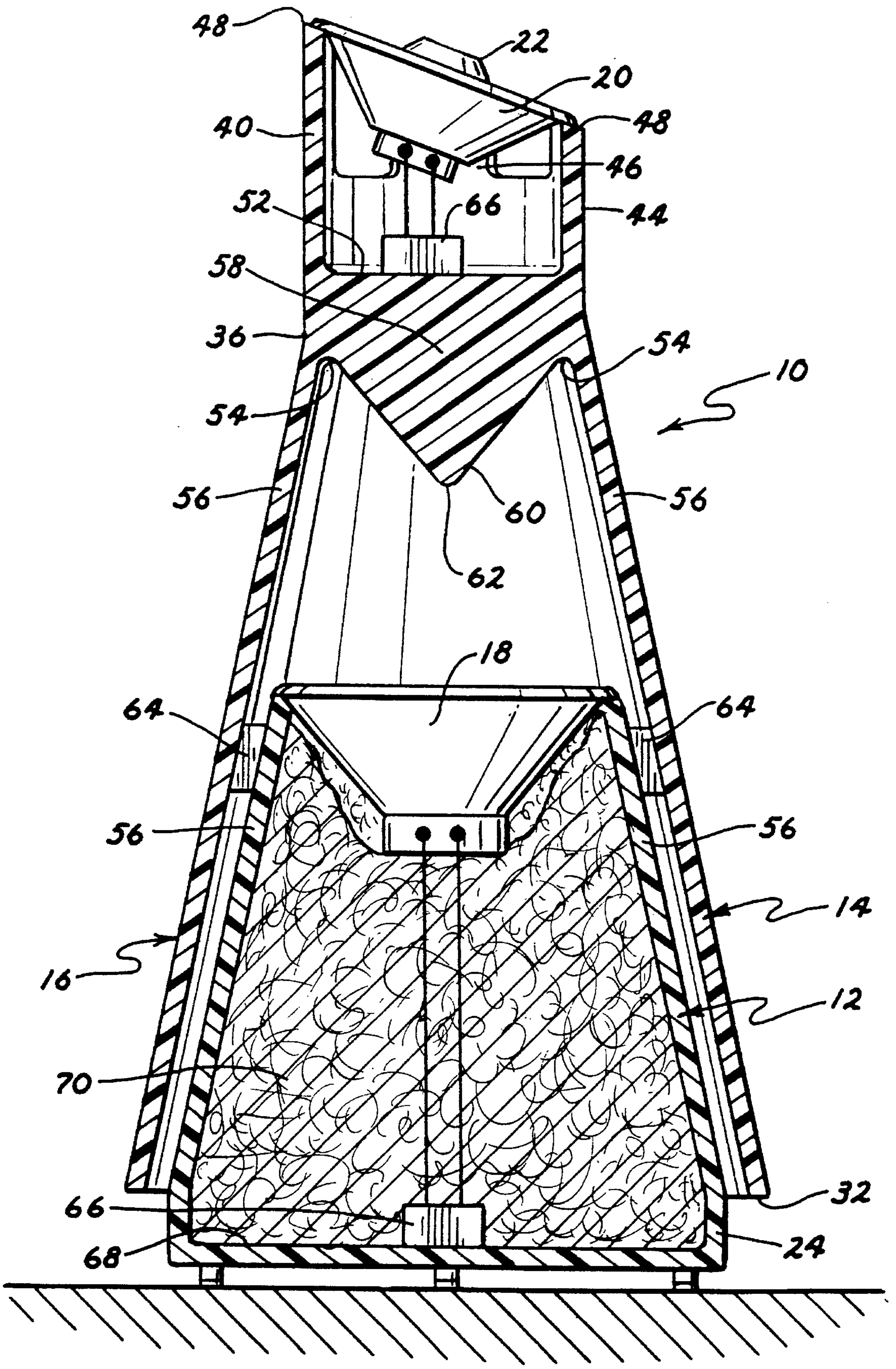
FIG. 3 is a side cross section view of the enclosure and drivers of the sound imaging system of FIG. 1 taken through line 2—2 of FIG. 1.
Figure 4:
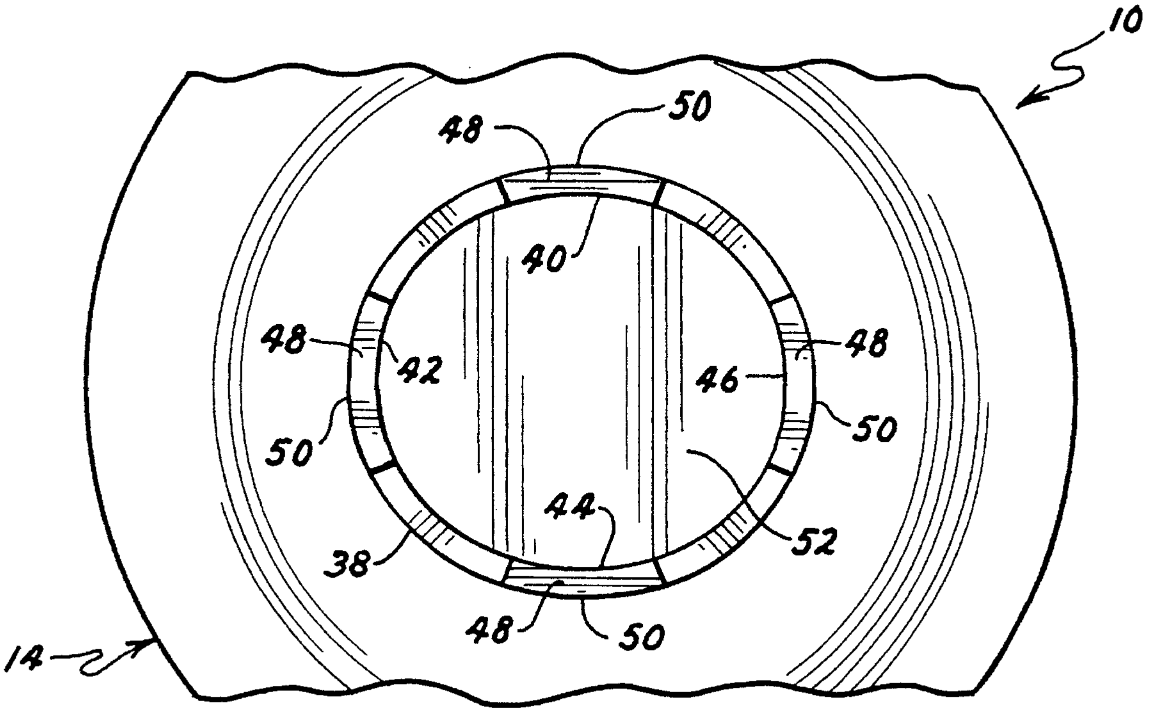
FIGS. 4 and 5 are top views of the combined midrange and high frequency drivers shown mounted to the upper enclosure unit of the sound imaging system of this invention.
Figure 5:
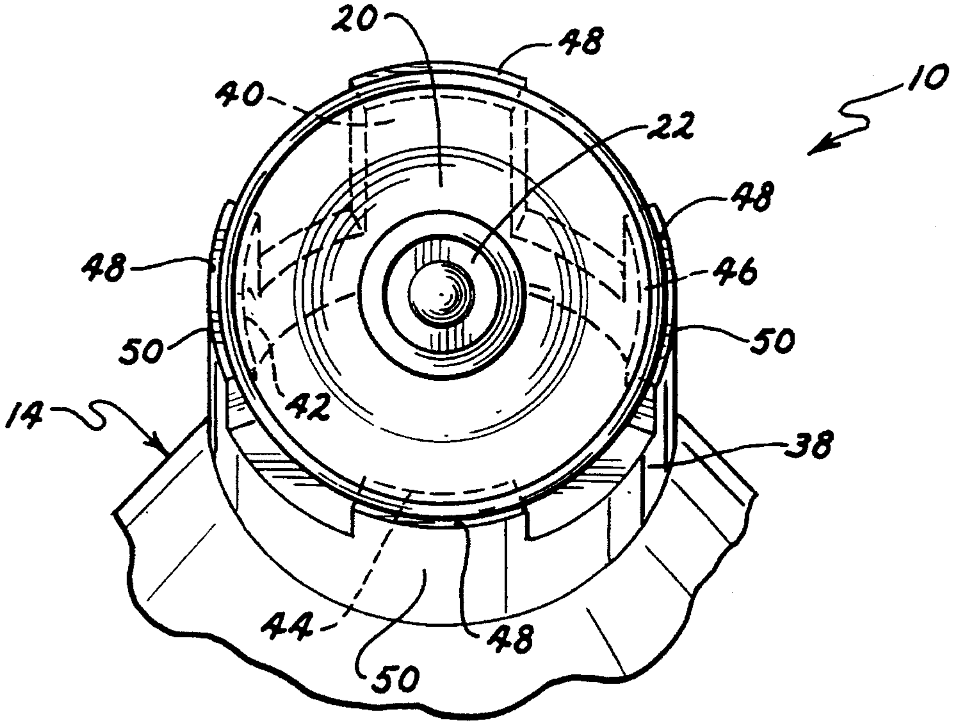

Referring particularly to FIGS. 1–3, it may be seen that the base unit 12 has a generally truncated conical shape with an overall height of 24 7/16" including a generally cylindrical bottom skirt 24 having an outer diameter of 24 7/16" and a height of 3". The truncated conical portion of the base member 12 tapers inwardly to an outer diameter of 15⅝41 at the top edge 26 thereof. The base unit 12 is fabricated from a low temperature fiberglass resin such as Polylite® Reichold 33155-00 having an approximately ¾" thickness throughout. The base unit 12 is generally hollow, and the top edge defines a generally circular opening 28 with an inwardly tapered lip 30 having a diameter and taper matching the housing or rim of the particular bass driver 18.

The upper unit 14 includes has an overall height measured between the bottom edge 32 and uppermost point 34 of 54", including a truncated conical segment that extends 1/16" upwardly from the bottom edge 32 and tapers inwardly from a generally circular outer diameter of 28" along the bottom edge 32 to an outer diameter of 12 9/16" along a generally circular median line 36 disposed 11" below the uppermost point 34. The portion of the upper unit 14 above the median line 36 forms a crown structure 38 including four vertical legs 40, 42, 44, 46 or supports that are generally semicircularly-shaped in conformity with the generally cylindrical outer surface of the crown structure 38, and which each circumscribe an arc of approximately 45° measured relative to a vertical axis extending through the radial center of the crown structure 38 and truncated conical section of the upper unit 14. The top surfaces 48 of each of the vertical legs 40–46 of the crown structure 38 define a plane extending downwardly and away from the uppermost point 34 at an angle of 20° relative to horizontal, with the midpoint of the tallest vertical leg 40 intersecting the uppermost point 34 of the crown structure 38. The maximum diametric distance between the outer surfaces 50 of the front and rear vertical legs 44, 40 is 12⅝", whereas the maximum diametric distance between the outer surfaces 50 of the side vertical legs 42, 46 is 11 13/16", so that when the vertical legs 40–46 are cut by the plane at a 20° angle relative to horizontal to form the top surfaces 48 of each of the vertical legs 40–46 of the crown structure 38, the top surfaces 48 define a generally circular platform of broken or discontinues elements.

As with the base unit 12, the upper unit 14 is fabricated from the same low temperature fiberglass resin having an approximately ¾" thickness throughout, and is generally hollow with the exception of the region bounded by the median line 36 and between the crown structure 38 and truncated conical section beneath the median line 36. The upper unit 14 defines a generally horizontal planar floor 52 disposed approximately 11" below the uppermost point 34 and extending completely across the interior of the crown structure 38 approximately 1 15/16" above the median line 36. The interior of the upper unit 14 beneath the planar floor 52 of the crown structure 38 is solid throughout a height of approximately 3 9/16" to a point where a peripheral juncture 54 is formed between the top segment of the truncated conical wall 56 and the solid region 58, with the peripheral juncture 54 extending around the interior circumference of the upper unit 14 and having a radius of approximately ½". The solid region 58 extends downwardly to form an inverted conical acoustic lens 60 or deflector which depends into the interior region of the upper unit 14 and whose surface defines an angle of 40° measured from a vertical line bisecting the apex 62 of the lens 60 and the radial axis of the upper unit 14, thereby forming an 80° angle between opposing faces of the acoustic lens 60 with a 1" radius at the apex 62.

The upper unit 14 is maintained and supported in position above the base unit 12 by a plurality of circumferentially unequally spaced-apart brackets 64 or knee-joints which may be fixed to either the base unit 12 or upper unit 14, and which may alternately permit vertical and lateral adjustment in the levelling of the upper unit 14 and spacing between the inner surface of the truncated conical wall 56 of the upper unit 14 and the truncated conical exterior surface of the base unit 12 as shown in FIG. 3. The preferred spacing or gap between the upper unit 14 and base unit 12 is therefore approximately 1" measured along a horizontal line extending between the upper unit 14 and base unit 12 when both the inner surface of the truncated conical wall 56 of the upper unit 14 and the truncated conical exterior surface of the base unit 12 form a 12° angle relative to vertical.

The base driver 18 is mounted within the opening 28 of the base member 12 suspended from the top edge 26 by the rim or housing, with bass driver 18 being electrically and operatively connected to an amplifier, tuner, or other sound-system component (not shown) via a cross-over network 66 disposed along the floor 68 of the base unit 12. The interior of the base unit 12 between the bass driver 18 and floor 68 is filled with approximately 40 oz of Airtex™ Polyplus™ 100% polyester filament filler 70.

The base driver 18 is mounted within the opening 28 of the base member 12 suspended from the top edge 26 by the rim or housing so that the base driver 18 lies in a generally horizontal plane and projects sound energy upward, with the bass driver 18 being electrically and operatively connected to an amplifier, tuner, or other sound-system component (not shown) that produces an electrical signal that may be converted to sound energy by the bass driver 18, the electrical connection including a 12 db per octave crossover network 66 disposed along the floor 68 of the base unit 12.

Similarly, the combined or composite midrange driver 20 and high frequency driver 22 are mounted within the crown structure 38 of the upper member 14 suspended from the top edges 48 of the vertical legs 40–46 by the rim or housing at a 20° angle relative to a horizontal plane, with the midrange driver 20 and high frequency driver 22 being electrically and operatively connected via a similar cross-over network 66 disposed either along the horizontal planar floor 52 of the crown structure 38 or floor 68 of the base unit 12 to the source of an electrical signal that may be converted to sound energy.

Figure 6:
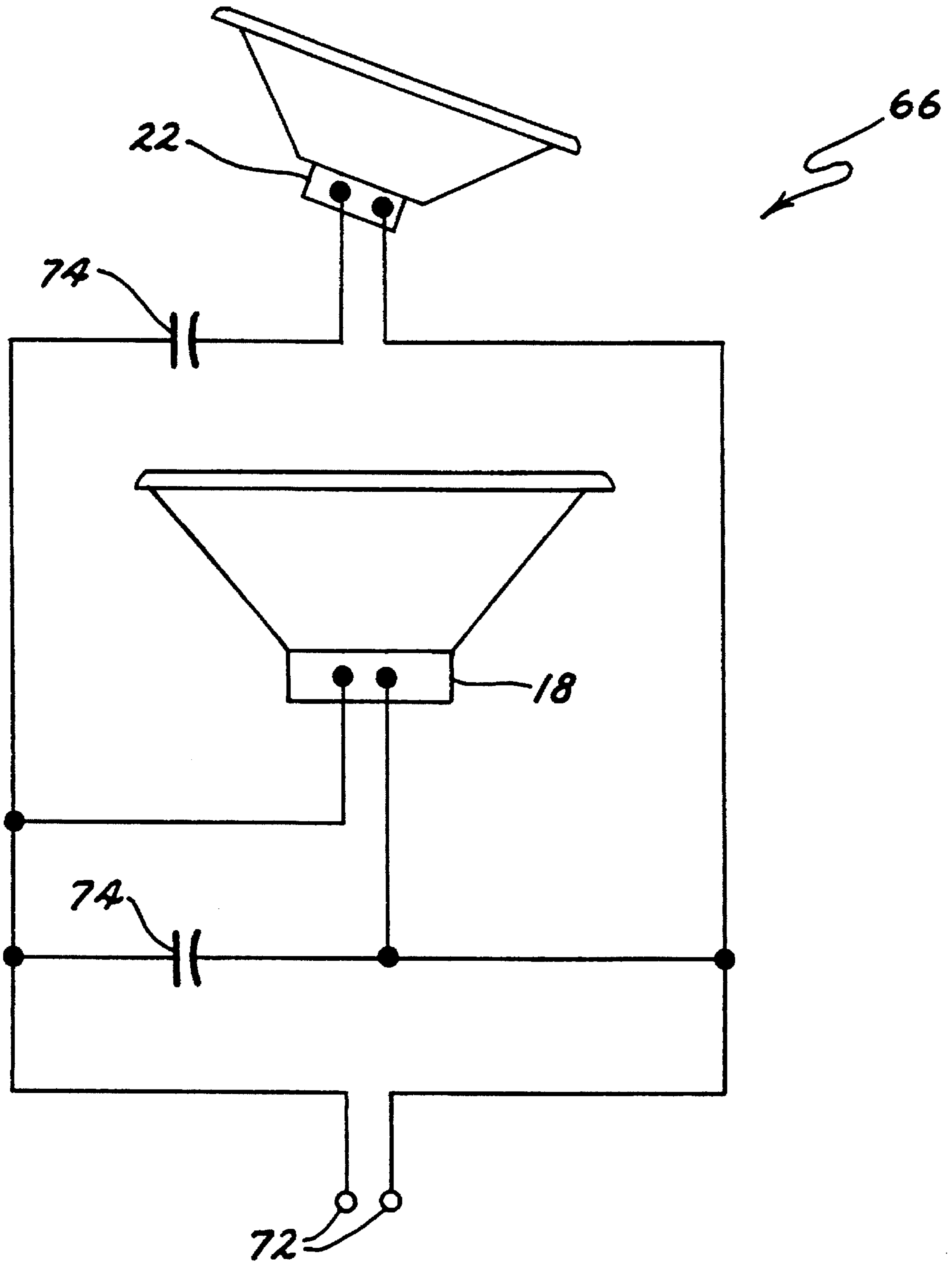
FIG. 6 is a schematic of the cross over circuit utilized with the drivers of the sound imaging system of this invention.

Referring to FIG. 6, a standard cross-over network 66 is shown connected to both the bass driver 18 and high frequency driver 22, the cross-over network 66 extending from a pair of input connections 72 through a pair of capacitors 74 such as Solen™ fast capacitors and tuned in a conventional manner by inductors (not shown) such as Hepta-Litz multi-wind high gauge copper filament coils.

In one typical embodiment, the bass driver 18 operates at up to 150 cycles utilizing a 6–12 db crossover network 66, whereas the 12" midrange driver 20 and high frequency driver 22 utilize a combination 6–12 db crossover network 66 operating in a range of 85–2700 cycles for the midrange driver 20 and 2700 cycles to infinity for the high frequency driver 22. The standard foam damping is preferably removed from the composite midrange driver 20 and high frequency driver 22 and replaced by ¾ gm of the polyester filament filler 70. The cross-over networks 66 (or similar divider or splitter with highpass and lowpass filters) provides a protective cutoff at 150 db, with the sound imaging system 10 utilizing a 93 db bass driver 18 effectively matched to 97 db at the reflective surface of the acoustic lens 60 or deflector.

In operation, two of the enclosures 16 housing the three drivers 18–22 are spaced 6'6"apart measured from their radial axes, and focussed at a point disposed 7' perpendicularly along a line bisecting the line connecting the two radial axes. The outer peripheral edges of each enclosure 16 along the bottom edge 32 of the upper unit 14 are spaced 6' away from a back wall opposing the focal point.

Sound energy projected upwardly from the base driver 18 contacts and is reflected or deflected by the acoustic lens 60 such that the sound energy is traverses downwardly along and between the spaced apart truncated conical walls 56 of the upper unit 14 and base unit 12 and emanates radially therefrom beneath the lower edge 32 and outwardly away from the skirt 24 in all directions. The sound energy emanating from the base driver 18 will traverse the interior of the upper unit 14 as a generally longitudinal wave, although some diffusion or spreading and curvature of the wavefront will normally occur especially at the peripheral edge of the waveform. Some of the sound energy emanating from the base driver 18 will be reflected from the surface of acoustic lens 60 or the peripheral edge 54 thereof as it curves into the truncated conical wall 56 and be reflected directly through the gap formed between the spaced apart truncated conical walls 56 of the upper unit 14 and base unit 12. A portion of the sound energy will be reflected from the conical surface of acoustic lens 60 toward the truncated conical wall 56 of the upper unit 14 and then alternately back and forth between the truncated conical walls 56 of the upper unit 14 and base unit 12 in a zig-zagging pattern until radiating outwardly away from the skirt 24 beneath the lower edge 32 of the upper unit 14, thereby extending or lengthening the linear path traversed by the sound energy as the radius of the path increases. The effect is therefore similar to a megaphone in which the peripheral circumference of the sound energy's longitudinal wave is increased as the wave traverses the megaphone, and the length of the linear path traversed by that wave is also increased due to the back-and-forth reflection of the sound energy between the truncated conical walls 56 of the upper unit 14 and base unit 12.

The composite midrange and high frequency drivers 20, 22 are supported at the top of the upper unit on a crown structure having a plurality of vertical legs defining a platform oriented approximately 20° relative to horizontal. Sound energy emanating from the midrange and high frequency drivers 20, 22 is projected upwardly, and radiates outwardly from the sound imaging system 10 and reflected off the ceiling of the room in which the sound imaging system is placed, converging upon the focal point which is similarly the preferred listening position.

While the preferred embodiment of the above sound imaging system 10 has been described in detail with reference to the attached drawing Figures, it is understood that various changes and adaptations may be made in the sound imaging system 10 without departing from the spirit and scope of the appended claims.

What is claimed is:

1. A sound imaging system for use with a first driver, said first driver producing sound energy in response to an electrical signal, said sound imaging system comprising:

a base unit, said base unit including a base wall section having a generally truncated conical shape, the first driver being mounted on said base unit and oriented in a generally horizontal plane; and an upper unit, said upper unit including an upper wall section having a generally truncated conical shape, said upper unit being disposed generally above said base unit such that at least a portion of each of said upper wall section and said lower wall section are at least partially contiguous with one another and are spaced apart from one another to define a gap therebetween, said upper unit including an acoustic lens capable of reflecting the sound energy produced by the first driver, whereby the sound energy emanating from the first driver is projected generally upwardly from the first driver, reflected generally downwardly from the acoustic lens through the gap between the upper wall section and the base wall section, and radially outward from the sound imaging system.

2. The sound imaging system of claim 1 wherein the acoustic lens is defined by and integral with the upper unit of the sound imaging system.

3. The sound imaging system of claim 1 wherein the acoustic lens has a generally inverted conical shape.

4. The sound imaging system of claim 1 wherein the upper unit defines an interior region having a top, and wherein the acoustic lens is disposed proximate to said top of said interior region.

5. The sound imaging system of claim 4 wherein the acoustic lens has a generally conically shaped surface and depends from the upper unit into the interior region of the upper unit.

6. The sound imaging system of claim 5 wherein the first driver has a center and the acoustic lens has an apex, said apex of the acoustic lens being positioned generally vertically above said center of the first driver.

7. The sound imaging system of claim 1 wherein the upper wall section is oriented generally 12° relative to vertical.

8. The sound imaging system of claim 1 wherein the upper unit has an interior region and the acoustic lens has a generally conically shaped surface and depends from the upper unit into said interior region of the upper unit, said generally conically shaped surface being oriented generally 40° relative to vertical.

9. The sound imaging system of claim 1 wherein the upper unit and the base unit each have a radial axis, said radial axis of the upper unit being generally aligned with said radial axis of the base unit.

10. The sound imaging system of claim 1 wherein the portion of each of the upper wall section and the lower wall section that are generally contiguous with one another extend along a height of approximately 23"–24" measured vertically.

11. The sound imaging system of claim 1 wherein the gap defined between the portion of each of the upper wall section and the lower wall section that are generally contiguous with one another and are spaced apart from one another is approximately 1" measured horizontally.

12. The sound imaging system of claim 1 wherein the base unit rest on a surface, and wherein the upper unit has a bottom edge, said bottom edge being spaced apart from said surface.

13. The sound imaging system of claim 12 wherein the bottom edge of the upper unit is spaced apart from the surface a distance of approximately 3" measured vertically.

14. The sound imaging system of claim 12 wherein the base unit defines a skirt region, said skirt region extending generally continuously around the base unit and being disposed generally beneath the bottom edge of the upper unit.

15. The sound imaging system of claim 1 wherein the generally truncated conical shape of the base wall section is defined by an outer surface thereof having an upper circumference and a lower circumference, said upper circumference being disposed above said lower circumference, said upper circumference being approximately 15"–16" in diameter and said lower circumference being approximately 24"–25" in diameter.

16. The sound imaging system of claim 15 wherein the upper circumference and the lower circumference are spaced apart a distance of approximately 21"–22" measured vertically.

17. The sound imaging system of claim 1 wherein the generally truncated conical shape of the upper wall section is defined by an inner surface thereof having an upper circumference and a lower circumference, said upper circumference being disposed above said lower circumference, said upper circumference being approximately 11"–12" in diameter and said lower circumference being approximately 26"–27" in diameter.

18. The sound imaging system of claim 17 wherein the upper circumference and the lower circumference are spaced apart a distance of approximately 37"–39" measured vertically.

19. The sound imaging system of claim 1 wherein the acoustic lens has a generally conically shaped surface including a peripheral edge and an apex, and wherein the acoustic lens is connected to and depends from the upper unit at said peripheral edge into the interior region of the upper unit a distance of approximately 5"–6" measured vertically from said peripheral edge to said apex.

20. The sound imaging system of claim 1 wherein the base unit has a top defining an opening and a lip, and wherein the first driver is mounted within said opening and supported on said lip.

21. The sound imaging system of claim 20 wherein the base unit defines an interior region, and wherein the first driver is suspended at least partially within said interior region.

22. The sound imaging system of claim 1 wherein the acoustic lens has a generally conically shaped surface and an apex, said apex having a generally arcuately curved surface with a radius of approximately 1".

23. The sound imaging system of claim 1 used with a second driver, said second driver producing sound energy in response to an electrical signal, the upper unit having a top, said sound imaging system further comprising:

a support structure for the second driver, said support structure being connected to and extending generally upwardly from the upper unit proximate to the top thereof, said support structure defining a platform, the second driver being mounted on said platform.

24. The sound imaging system of claim 23 wherein the platform of the support structure is oriented approximately 20° relative to horizontal.

25. The sound imaging system of claim 23 wherein the support structure includes a plurality of legs, each of said plurality of legs extending generally vertically upward from the top of the upper unit, each of said plurality of legs having a top end and a height such that said plurality of legs define the platform.

26. The sound imaging system of claim 23 wherein the second driver is suspended at least partially within the support structure.

27. The sound imaging system of claim 23 wherein the support structure has a generally cylindrical shape.

28. The sound imaging system of claim 27 wherein the support structure has a circumference and includes a plurality of legs, each of said plurality of legs extending at least partially around said circumference.

29. The sound imaging system of claim 23 wherein the platform has an uppermost point, said uppermost point being disposed approximately 11" above the top of the upper unit.

30. The sound imaging system of claim 1 wherein the upper unit and the lower unit are each fabricated from fiberglass.

31. The sound imaging system of claim 4 wherein the acoustic lens has a generally conically shaped surface, and wherein at least a portion of the sound energy is reflected from the acoustic lens toward the upper wall section, and then is reflected alternatingly back and forth between the upper wall section and the lower wall section as the sound energy traverses the gap between said upper wall section and said base wall section before the sound energy radiates outwardly therefrom.

32. A method for sound imaging from a first driver, said method comprising the steps of:

mounting the first driver on a base unit, said base unit including a base wall section having a generally truncated conical shape, the first driver being oriented in a generally horizontal plane;

disposing an upper unit in confronting relation to said base unit, said upper unit including an upper wall section having a generally truncated conical shape, said upper unit being disposed generally above said base unit such that at least a portion of each of said upper wall section and said lower wall section are at least partially contiguous with one another and are spaced apart from one another to define a gap therebetween, said upper unit including an acoustic lens capable of reflecting the sound energy produced by the first driver; and producing sound energy from the first driver in response to an electrical signal, said sound energy being projected generally upwardly from the first driver, reflected generally downwardly from said acoustic lens through said gap between said upper wall section and said base wall section, and radially outward therefrom.

* * * * *